(12) United States Patent
Hwang (10) Patent No.: US 8,305,541 B2
(45) Date of Patent: Nov. 6, 2012

(54) TAPE CARRIER PACKAGE AND LIQUID CRYSTAL DISPLAY DEVICE HAVING THE SAME

(75) Inventor: In-Yong Hwang, Gyeonggi-do (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 458 days.

(21) Appl. No.: 12/562,210

(22) Filed: Sep. 18, 2009

(65) Prior Publication Data
US 2010/0214519 A1 Aug. 26, 2010

(30) Foreign Application Priority Data
Feb. 20, 2009 (KR) .............................. 2009-0014196

(51) Int. Cl.
*G02F 1/1345* (2006.01)
*H05K 1/11* (2006.01)

(52) U.S. Cl. ........................................ 349/150; 361/789

(58) Field of Classification Search .................. 349/150; 361/789
See application file for complete search history.

(56) References Cited

U.S. PATENT DOCUMENTS

| 2004/0036833 | A1* | 2/2004 | Monzen | 349/158 |
|---|---|---|---|---|
| 2007/0091243 | A1* | 4/2007 | Hong et al. | 349/150 |
| 2008/0013029 | A1* | 1/2008 | Kim | 349/150 |
| 2009/0147204 | A1* | 6/2009 | Kang | 349/150 |

* cited by examiner

*Primary Examiner* — Michael Caley
(74) *Attorney, Agent, or Firm* — F. Chau & Associates, LLC (57) ABSTRACT

A tape carrier package (TCP) includes a base film, an integrated circuit (IC) chip and an output pad group. The IC chip is formed on the base film. The output pad group is formed on a first end of the base film. The output pad group includes a plurality of output blocks having a plurality of output pads, wherein the plurality of output pads in an output block have substantially the same width as each other. The widths of the output pads from one output block to another output block are different from each other.

17 Claims, 8 Drawing Sheets

TAPE CARRIER PACKAGE AND LIQUID CRYSTAL DISPLAY DEVICE HAVING THE SAME

CROSS-REFERENCE TO RELATED APPLICATION

This application claims priority under 35 U.S.C. §119 to Korean Patent Application No. 2009-14196, filed on Feb. 20, 2009 in the Korean Intellectual Property Office (KIPO), the contents of which are herein incorporated by reference in their entirety.

BACKGROUND OF THE INVENTION

1. Technical Field

Example embodiments of the present invention relate to a tape carrier package (TCP) and a liquid crystal display (LCD) device having the TCP. More particularly, example embodiments of the present invention relate to a TCP capable of preventing misalignments and an LCD device having the TCP.

2. Discussion of the Related Art

Generally, a display device processes data in an information processing device to be displayed as certain images that can be recognized by a user. Flat panel display devices are widely used due to their light weight and high resolution.

The flat panel display devices, such as liquid crystal display (LCD) devices, plasma display panel (PDP) devices and organic light-emitting diode (OLED) devices are being developed as alternatives to cathode ray tube (CRT) devices.

For example, an LCD device is an example of a flat panel display device, and displays an image using liquid crystal. The LCD device is thin and light and requires low power consumption and a low driving voltage.

The LCD device includes a plurality of pixels defined by gate lines and source lines. The LCD device includes a display area displaying an image and a peripheral area surrounding the display area.

In addition, to display a certain image, the LCD device requires a driving integrated circuit (IC) converting an image applied from an external device into a driving signal to provide the driving signal to a display panel.

Methods for mounting the driving IC on the display panel of the LCD device include a chip-on-film (COF) or tape carrier package (TCP) method, in which the driving IC is mounted on a film, and a chip-on-glass (COG) method, in which the driving IC is directly mounted on the display panel.

The TCP includes one side bonded to a side of the display panel and another side bonded to a printed circuit board (PCB). The bonding of the TCP may be accomplished by an outer lead bonding (OLB) process using temperature and pressure.

However, the temperature and the pressure according to the OLB process transform the shape of the film. Accordingly, spaces of output pads formed on the output pad portion of the TCP are different from spaces of the input pads foamed on the lower substrate, so that when the TCP is attached to the lower substrate, a misalignment may be generated.

When the output pad portion of the TCP is one-to-one connected to the input pad portion of the lower substrate, the misalignment between the output pads and the input pads may be larger from a center portion toward an edge of the base film, thereby generating defects such as electrical shorts between the output pads and the input pads.

SUMMARY OF THE INVENTION

Example embodiments of the present invention provide a tape carrier package (TCP) capable of minimizing display quality defects to have long-term reliability, and a liquid crystal display (LCD) device having the above-mentioned TCP.

According to an embodiment of the present invention, a TCP includes a base film, an integrated circuit (IC) chip and an output pad group. The IC chip is formed on the base film. The output pad group is formed on a portion of the base film, and comprises a plurality of output blocks. Each of the output blocks includes a plurality of output pads having substantially the same width as each other. Also, a width of the output pads corresponding to one of the output blocks is different from a width of the output pads corresponding to another output block adjacent to the one of the output blocks.

The output pad group includes a first output block including a plurality of output pads having a first width, a second output block including a plurality of output pads having a second width wider than the first width and a third output block including a plurality of output pads having a third width wider than the second width.

The first output block, the second output block and the third output block are sequentially disposed from a center portion of the base film to edge of the base film.

The widths of the output pads of each of the output blocks increase from a center portion of the base film to an edge of the base film.

Each of the output blocks respectively includes at least one output pad portion having substantially the same pitch between output pads, and the pitches differ between adjacent the output pad portions.

The pitches of the output pad portions increase from the center portion of the base film to an edge of the base film.

Each of the output blocks includes at least one output pad portion having substantially the same pitch between output pads, and the pitches between different output pad portions are different from each other.

The pitches of the output pad portions increase from a center portion of the base film to an edge of the base film.

According to another embodiment of the present invention, an LCD device includes a printed circuit board (PCB), a TCP, and a liquid crystal panel. The TCP includes a base film, an IC chip formed on the base film and an output pad group formed on a portion of the base film, wherein the output pad group comprises a plurality of output blocks. Each of the output blocks comprises a plurality of output pads having substantially the same width as each other, and widths of the output pads corresponding to one of the output blocks are different from widths of the output pads corresponding to another output block adjacent to the one of the output blocks. The liquid crystal panel includes a lower substrate, an upper substrate and a liquid crystal layer interposed between the lower substrate and the upper substrate, and receiving data signals and gate signals from the PCB through the TCP to display an image.

The liquid crystal panel includes an input pad group having a plurality of input pads which have substantially the same width as each other, and the input pad group corresponds one-to-one to the output pad group formed on the base film.

The input pad group includes a plurality of input pad portions, each of the input pad portions having a pitch between input pads, and a pitch of one of the input pad portions being different from a pitch of another input pad portion adjacent to the one of the input pad portions.

The pitches of the input pad portions increase from a center portion of the input pad group to an edge of the input pad group.

The widths of each of the input pads is wider than the widths of each of the output pads.

Each of the pitches of the output pad portions are proportional to the pitches of the input pad portions, and a whole width of the base film on which the output pads are formed is less than a whole width of the output pad group by about 0.1% when the base film is expanded.

The widths of the output pads of each of the output blocks increase from the center portion of the base film to the edge of the base film.

The widths of the output pads of each of the output blocks increase from the center portion of the base film to the edge of the base film.

The widths of each of the input pads are wider than the widths of each of the output pads.

According to a TCP and a liquid crystal display device having the TCP, pitches of input pads formed on a liquid crystal panel are changed and widths of output pads formed on a base film are changed, to thereby improve image quality uniformity.

In addition, when the lower substrate of the liquid crystal panel is connected to the base film of the TCP, the base film expands more than the lower substrate by heat or pressure. Accordingly, the pitches and widths of the output pads are variably designed, thereby ensuring the highest process margin for misalignments between the output pads and the input pads to minimize image quality defects and to improve the long-term reliability.

BRIEF DESCRIPTION OF THE DRAWINGS

The above and other features of the present invention will become more apparent by describing in detailed example embodiments thereof with reference to the accompanying drawings, in which.

DETAILED DESCRIPTION OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Figure 1:
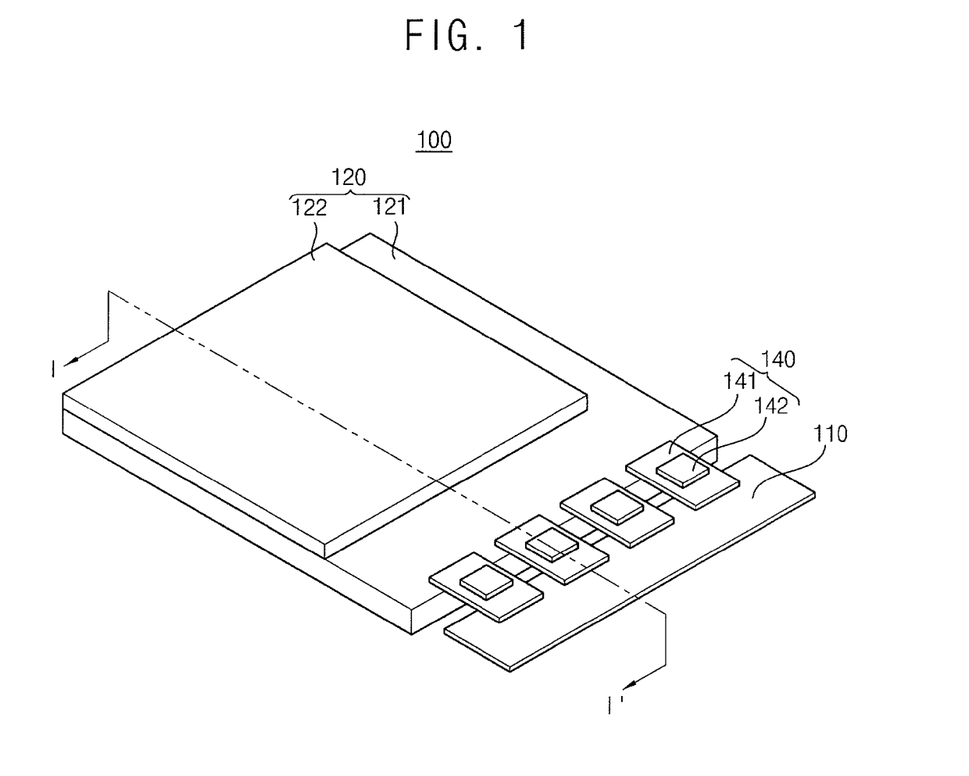
FIG. 1 is a perspective view illustrating a liquid crystal display (LCD) device according to an exemplary embodiment of the present invention.
Figure 2:
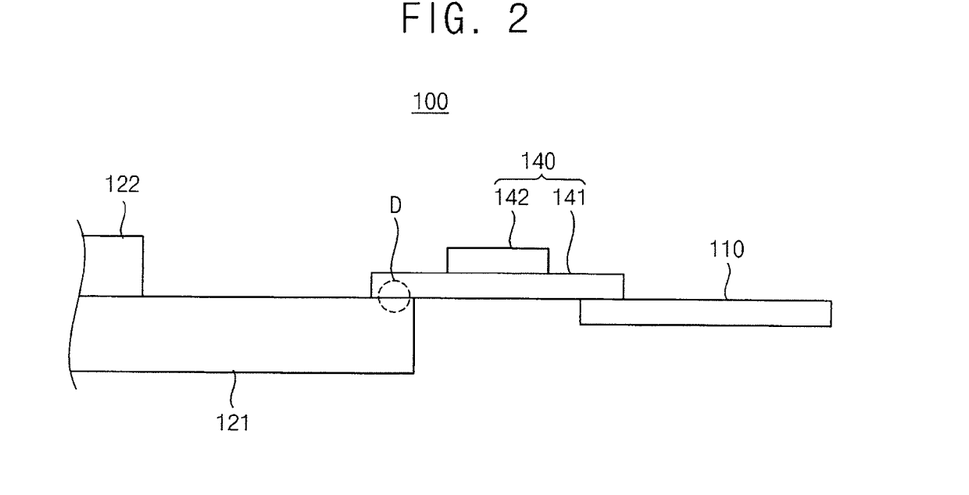
FIG. 2 is a partial cross-sectional view of the LCD device taken along a line I-I' of FIG. 1.
Figure 3:
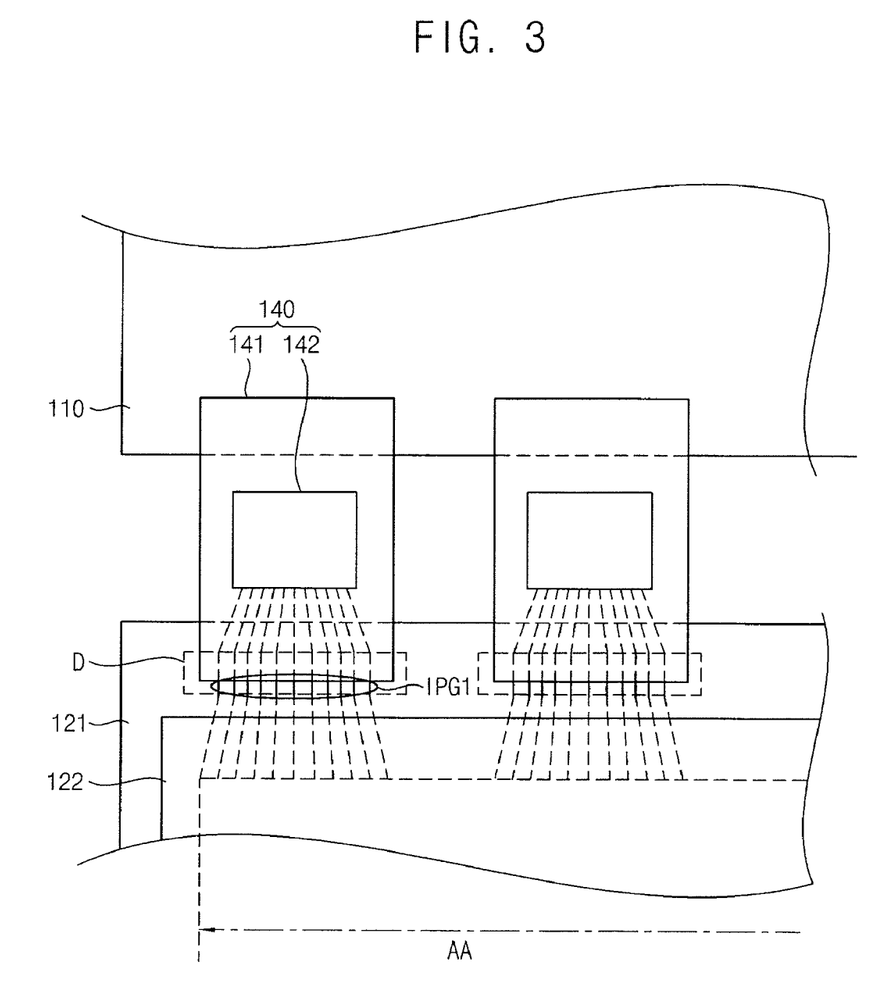
FIG. 3 is a partial plan view of the LCD device of FIG. 1.

FIG. 1 is a perspective view illustrating a liquid crystal display (LCD) device according to an exemplary embodiment of the present invention. FIG. 2 is a partial cross-sectional view of the LCD device taken along a line I-I' of FIG. 1. FIG. 3 is a partial plan view of the LCD device of FIG. 1.

Referring to FIGS. 1 to 3, the LCD 100 according to an exemplary embodiment includes a printed circuit board (PCB) 110, a liquid crystal panel 120 and a tape carrier package (TCP) 140.

The PCB 110 may be formed on a gate driving circuit side and a data driving circuit side on the liquid crystal panel 120 to apply data signals and gate signals to the liquid crystal panel 120. Alternatively, the data driving circuit side and the gate driving circuit side may be formed to be integrated into one driving circuit.

The liquid crystal panel 120 includes a lower substrate 121, an upper substrate 122 opposite to the lower substrate 121 and a liquid crystal layer (not shown) interposed between the lower substrate 121 and the upper substrate 122. The gate lines and the data lines crossing to gate lines are formed on the lower substrate 121. For example, pixel areas defined by the gate lines and the data lines are arranged in a matrix form. However, the pixel areas may also be otherwise defined. An active area AA displaying an image is defined on the pixel areas as illustrated in FIG. 3.

The TCP 140 electrically connects the PCB 110 and the liquid crystal panel 120. For example, a first end of the TCP 140, on which an integrated circuit (IC) chip 142 driving the liquid crystal panel 120 is mounted on, is connected to the lower substrate 121 of the liquid crystal panel 120, and a second end of the TCP 140 is connected to the PCB 110 to receive electrical signals.

As shown in FIG. 2, the TCP 140 is disposed between the lower substrate 121 and the PCB 110, so that opposite ends of the TCP 140 are connected to the lower substrate 121 and the PCB 110, respectively.

Referring to FIG. 3, pads (not shown) of an output group formed on one TCP 140 correspond one-to-one to pads of an input pad group IPG1 of a plurality of input pad groups formed on the lower substrate 121. A connection portion, where the output pad group is connected to the input pad group IPG1, is represented as "D."

Hereinafter, a more detailed description of the connection portion D of the lower substrate 121 and the TCP 140 will be described.

Figure 4A:
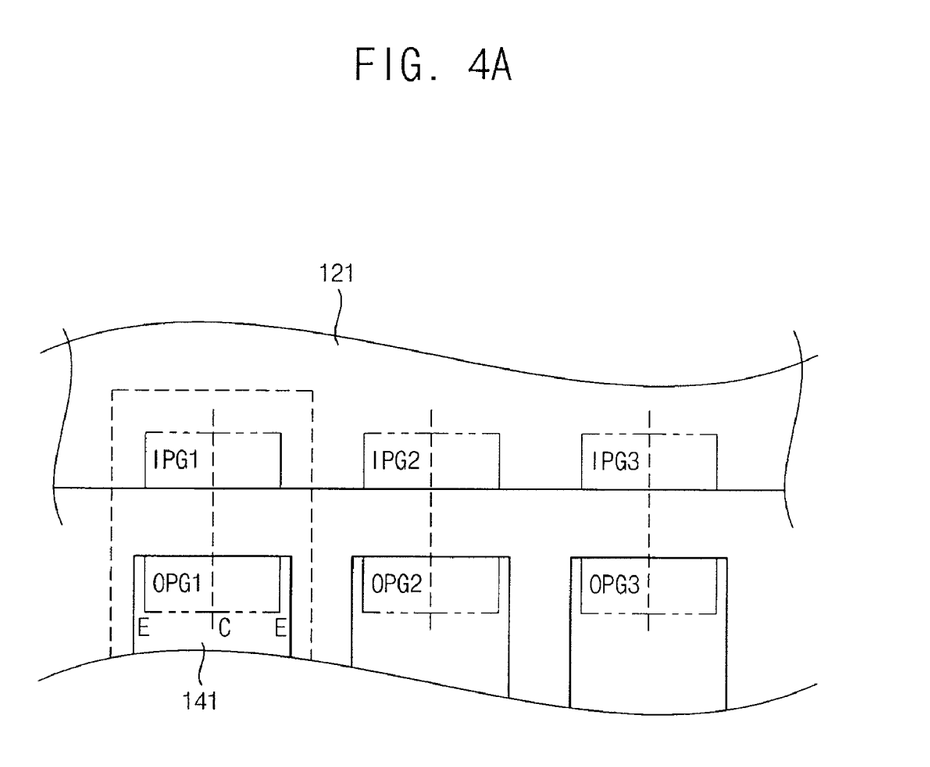
FIG. 4A is a plan view illustrating input pad groups and output pad groups according to an exemplary embodiment of the present invention.
Figure 4B:
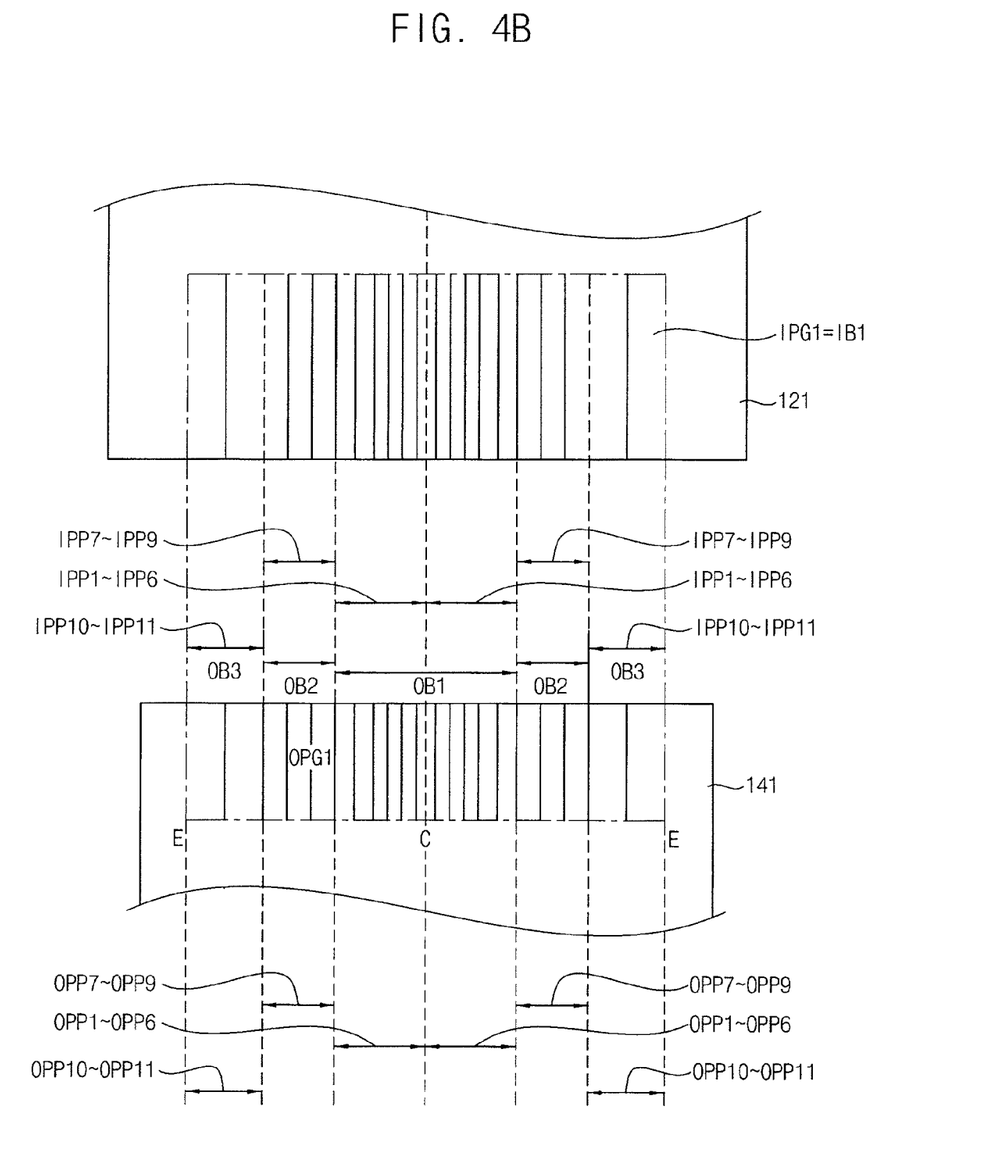
FIG. 4B is an enlarged plan view illustrating one input pad group and one output pad group of FIG. 4A.
Figure 5:
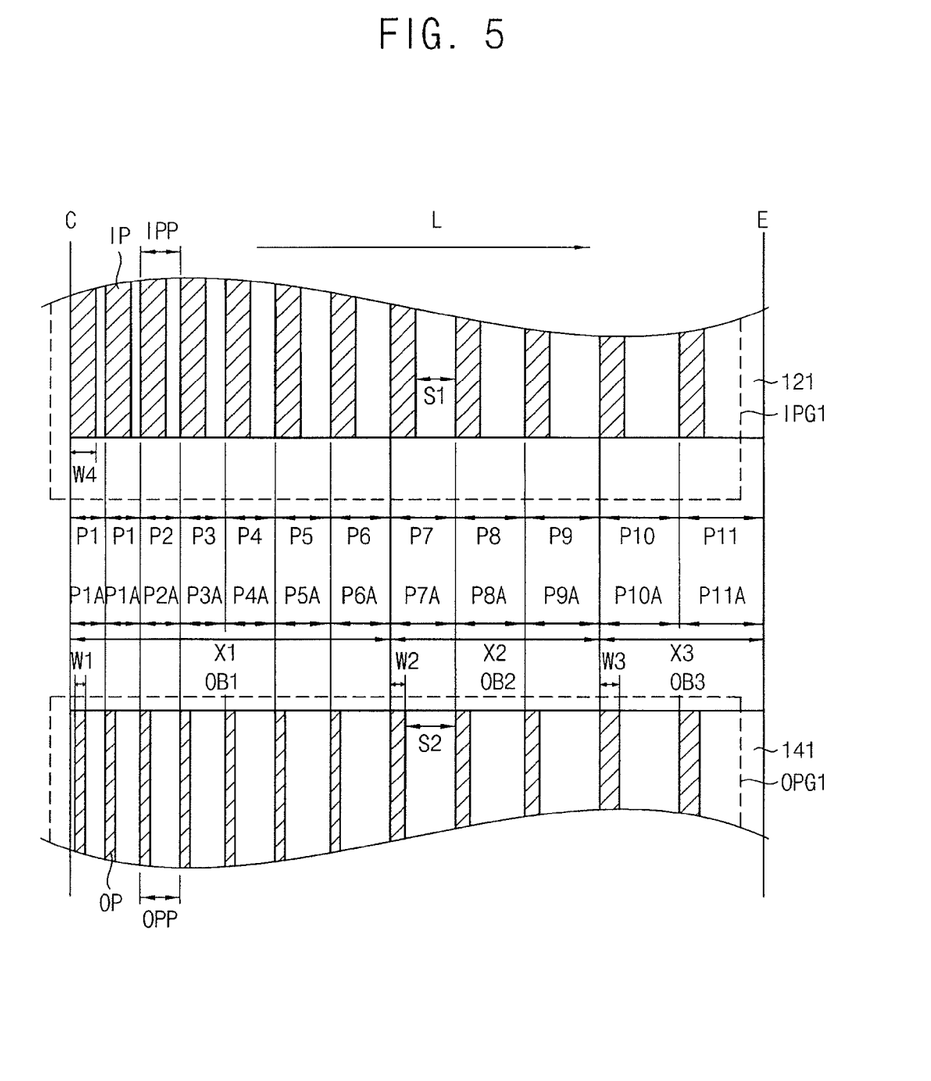
FIG. 5 is an enlarged plan view of a connection portion D of the input pad group and the output pad group of FIGS. 3, 4A and 4B.
Figure 6:
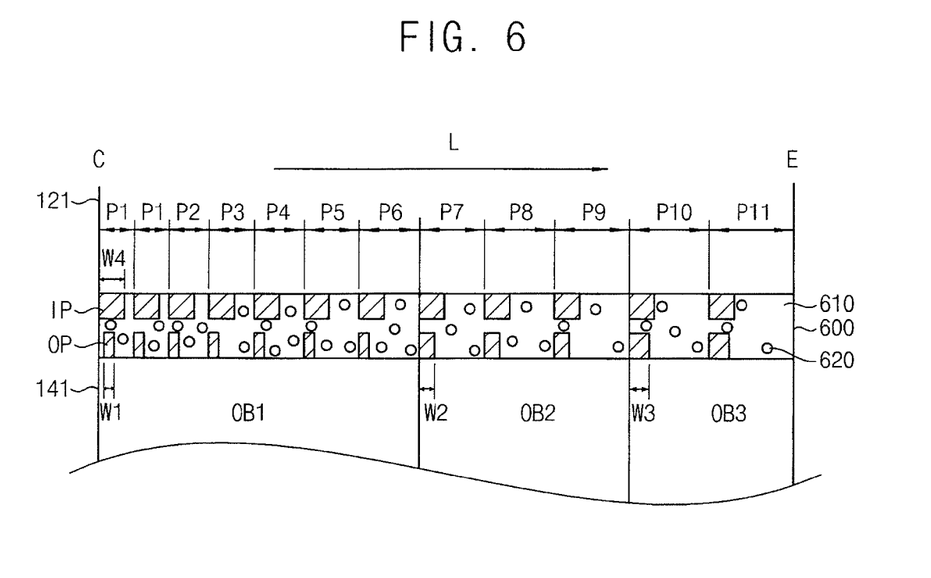
FIG. 6 is a cross-sectional view illustrating the input pad group and the output pad group of FIG. 5.

FIG. 4A is a plan view illustrating input pad groups and output pad groups according to an exemplary embodiment. FIG. 4B is an enlarged plan view illustrating one input pad group and one output pad group of FIG. 4A. FIG. 5 is an enlarged plan view of a connection portion D of the input pad group and the output pad group of FIGS. 4A and 4B. FIG. 6 is a cross-sectional view illustrating the input pad group and the output pad group of FIG. 5.

Referring to FIGS. 3 to 6, the TCP 140 according to an exemplary embodiment includes a base film 141, an IC chip 142 and one output pad group OPG1.

The base film 141 is made of a resin of a polyimide group. A linear expansion coefficient of the base film 141 is greater than that of the lower substrate 121, that is, a glass substrate of the liquid crystal panel 120. Accordingly, when the base film 141 is bonded on the lower substrate 121 through an outer lead bonding (OLB) process, the base film 141 is more easily expanded than the lower substrate 121 due to heat and pressure. Accordingly, a misalignment may be generated between the output pad group of the base film 141 and the input pad group of the lower substrate 121.

Thus, the pads may be designed in accordance with an expansion rate of the base film 141, that is, a misalignment amount.

The IC chip 142 is formed on a center portion of the base film 141 to drive the liquid crystal panel 120.

The first output pad group OPG1 formed on the TCP 140 is positioned at the connection portion D where the base film 141 contacts the lower substrate 121.

A detailed description of input pad groups IPG and output pad groups OPG that are formed on the lower substrate 121 and the base film 141, respectively, input pad blocks, input pad portions and input pads which are included in the input groups IPG, and output pad blocks, output pad portions and output pads which are included in the output pad groups OPG will be provided.

As shown in FIG. 4A, the lower substrate 121 includes a plurality of input pad groups IPG corresponding to the output pad groups OPG of the base films 141. A first output pad group OPG1 corresponds to the first input pad group IPG1, and a second output pad group OPG2 corresponds to the second input pad group IPG2, etc.

In FIG. 4B, a corresponding relation of the first output pad group OPG1 and the first input pad group IPG1 is represented in detail. The first output pad group OPG1 is formed to be symmetrical from the center C of the base film 141 to both edges E of the base film 141. Also, the first input pad group IPG1 is formed to be symmetrical from a center C of the first input pad group IPG1 to both edges E of the first input pad group IPG1 corresponding to the center C and both edges E of the base film 141.

The first output pad group OPG1 may be divided into three output blocks OB1, OB2, and OB3 from the center C to an edge E. Each of the output blocks OB1, OB2, and OB3 may include at least one output pad portion OPP (for example, OB1 may include OPP1 to OPP6, OB2 may include OPP7 to OPP9 and OB3 may include OPP10 to OPP11). Also, an output pad portion OPP may include a plurality of output pads OP, not shown. For example, the output pad group OPG may include at least one output block OB, each of the at least one output blocks OB may include at least one output pad portion OPP, and each of the output pad portions OPP may include the output pads OP, such that in terms of size, OPG>OB>OPP>OP.

The first input pad group IPG1 includes one input block IB having pitches at the edge E that are wider than pitches at the center C. For example, the first input pad group IPG1 is the same as the input block IB. The input block IB1 may be divided into a plurality of input pad portions (for example, IPP1 to IPP11 from the center C of the input block IB1 to edges E of the input block IB1). Also, an input pad portion IPP may include, although not shown, a plurality of input pads IP. For example, the input pad group IPG may include one input block IB, the input block IB may include at least one input pad portion IPP and an input pad portion may include a plurality of input pads IP having the substantially the same pitch. In terms of size, IPG(=IB)>IPP>IP.

The pads IP and OP respectively formed on the lower substrate 121 and the base film 141 correspond to each other in a one to one relationship, as shown in FIG. 5.

Referring to FIG. 5, the output pads of the output pad group OPG1 formed on the base film 141 according to an exemplary embodiment, for example, may be divided into three output blocks respectively having a first width X1, a second width X2, and a third width X3. For example, the first output pad group OPG1 may be divided into a first output block OB1, a second output block OB2 and a third output block OB3 in a direction from the center C to the edge E of the base film 141. Each of the output blocks OB may include at least one output pad portion OPP, wherein an output pad portion OPP includes output pads OP having the substantially the same pitch. Referring to FIG. 4B, according to an exemplary embodiment, the first output block OB1 may be divided into a first output pad portion OPP1 to a sixth output pad portion OPP6, the second output block may be divided into a seventh output pad portion OPP7 to a ninth output pad portion OPP9 and the third output block OB3 may be divided into a tenth output pad portion OPP10 to an eleventh output pad portion OPP11, in a direction from the center C to an edge E of the base film 141.

For example, the first output block OB1 may include a first output pad portion OPP1 having a first pitch P1A to a sixth output pad portion OPP6 having a sixth pitch P6A. The output pad portions OPP1 through OPP6 each include at least one output pad OP having a width W1. Also, the second output block OB2 may include a seventh output pad portion OPP7 having a seventh pitch P7A to a ninth output pad portion OPP9 having a ninth pitch P9A. The output pad portions OPP7 through OPP9 each include at least one output pad OP having a width W2. Also, third output block OB3 may include a tenth output pad portion OPP10 having a tenth pitch P10A to an eleventh output pad portion OPP11 having an eleventh pitch P11A. The output pad portions OPP10 through OPP11 each include at least one output pad OP having a width W3. Accordingly, eleven output pad portions OPP having different pitches from each other may be formed on one base film 141. The pitches are calculated by adding the first, second or third width W1, W2, or W3 of the output pads+a space width S2 between 2 output pads.

In FIG. 5, a plurality of the first output pad portions OPP1 is showed. Since the expansion rate in the center C of the base film 141 is small than that in the edge E of the base film 141, a plurality of the first output pad portions OPP1, having the width W1 and the first pitch P1A relatively smaller than the width W3 and the eleventh pitch P11A of the eleventh output pad portion OPP11 in the edge E of the base film 141, may be disposed in the center C of the base film 141. That is, output pad portions adjacently disposed to the center C of the base film 141 may be less considered for the process margin than output pad portions adjacently disposed to the edge E of the base film 141. For example, the number of each of the second output pad portion OPP2, the third output pad portion OPP3, etc adjacent to the center C of the base film 141 as well as the number of the first output pad portion OPP1 may be plural, with accordance to the expansion rate of the base film 141.

The width of the output pads OP becomes wider from the center C to the edge E of the first output pad group OPG1 formed on the base film 141 (W1<W2<W3). For example, the first width W1 of an output pad OP formed in output block OB1 may be about 15 μm, the second width W2 of an output pad OP formed in output block OB2 may be about 17 μm and the third width W3 of an output pad OP formed in output block OB3 may be about 19 μm. The pitch of the output pad portions OPP becomes wider from the center C to the edge E of the first pad group OPG1 (P1A<P2A<...<P10A<P11A). The widths of the output pads OP and pitches of the output pad portions OPP become wider from the center C to the edge E of the base film 141 because the expansion rate of the edge E is greater than that of the center C of the base film 141. Since the expansion rate of the edge E is greater, the probability of a misalignment being generated at the edge E is greater than that of a misalignment being generated at the center C. Accordingly, the third width W3 of the output pads OP and the pitches P10A and P11A of the output pad portions OPP10, OPP11 included in the third output block OB3 disposed at the edge E are wider than the width W1 of the output pads OP and the pitches P1A to P6A of the output pad portions OPP1-OPP6 included in the first output block OB1 and disposed at the center C. Accordingly, when a misalignment is generated, the output pads OP of the third output block OB3 may be more easily matched to the corresponding input pads IP of the input pad group.

According to an embodiment, the third width W3 of the output pads OP of the third output block OB3 is narrower than the fourth width W4 of the input pads IP. Accordingly, values of the first width W1 to the third width W3 may be set in accordance with the fourth width W4 of the input pads IP of the liquid crystal panel 120 according to an exemplary embodiment. The values of the first width W1 to the third width W3 may be changed in accordance with a variation of the fourth width W4 of the input pads IP of the liquid crystal panel 120.

According to an exemplary embodiment, the output pad group OPG is divided into 3 output blocks OB1, OB2, OB3. However, the number of the output blocks may be 2 or 5, in accordance with the type of and the width of the output pads OP. In addition, according to an exemplary embodiment, the output pad group OPG is divided into 11 output pad portions OPP1-OPP11. However, the number of the output pad portions OPP may be changed in accordance with the number of the input pad portions. The numbers of the output blocks and the output pad portions may be changed in accordance with the linear expansion coefficient of the base film 141, which corresponds to the glass substrate (the lower substrate) 121.

For example, when a first width of output pads is set to about 15 μm and a second width of the output pads is set to about 18 μm, the output pad group may be divided into 2 output blocks. As described above, a linear expansion coefficient of the base film when the output pad group is divided into 2 output blocks is different from the linear expansion coefficient when the output pad group is divided into 3 output blocks. For another example, when a first width of the output pads is set to about 15 μm, a second width of the output pads is set to about 16 μm, a third width of the output pads is set to about 17 μm, a fourth width of the output pads is set to about 18 μm, and a fifth width of the output pads is set to about 19 μm, the output pad group may be divided into output blocks. As described above, a linear expansion coefficient of the base film when the output pad group is divided into the 5 output blocks is similar to the linear expansion coefficient when the output pad group is divided into 3 output blocks. However, since the level of the width when the output pad group is divided into 5 output blocks is more detailed, the base film may be better aligned to prevent misalignments from being generated.

The width of the output pads may vary based on the input pads, which are formed according to the size of the lower substrate. The width of the output pads OP as described in the exemplary embodiments is based on the current sizes of liquid crystal panels. For example, the output pad group OPG may be divided into 3 output blocks OB considering the linear expansion coefficient of the base film 141 related to the lower substrate 121.

The input pads IP of the first input pad group IPG1 formed on the lower substrate have the fourth width W4, which is different from that of the output pads OP. However, the pitch of each of the input pad portions IPP included in the first input pad group IPG1 (the fourth width W4 of the input pad+a space width S1 between 2 input pads) may vary. For example, the pitches of the input pads IP increase from the center C to the edge E of the first input pad group IPG1.

The first input pad group IPG1 formed on the lower substrate 121 may be divided in correspondence with the output blocks OB1, OB2 and OB3, which are divided according to the width of the output pads OP. The pitches of the input pads IP may vary in the one input block IB. According to an embodiment, unlike the input block IB, the output blocks OB may each have a different constant pitch, so that the output blocks are divided according to 3 respective pitches. According to another embodiment, like the input block IB, the pitches may vary within the output blocks OB.

Accordingly, the input block IB corresponding to each of the output blocks OB1, OB2 and OB3 may include various types of input pad portions IPP which have different pitches.

The input pad group IPG1 may include the input pad portions IPP respectively having various pitches. As an example, when the pitch is in a range between about 32 μm and about 42 μm, the first input pad group IPG1 may be divided into 11 levels. The range of pitch of the input pad portions IPP may be in accordance with the size of the base film. The range of the widths of the input pads IP may be designed to be about 34 μm to about 40 μm according to the change of the size of the base film.

The number of the input pad portions IPP is divided into 11 levels according to an exemplary embodiment. However, the number of the input pad portions IPP may vary. For example, 6 input pad portions may be used. According to an embodiment, the pitches of the input pad portions IPP may be about 32 μm, about 34 μm, about 38 μm and about 42 μm. The difference in the pitches between the input pad portions may be linearly divided.

For example, in the range of about 32 μm to about 42 μm, the pitch of the first input pad portion is set to about 32 μm and the pitch of the second input pad portion is set to about 34 μm, that is, the space of each of the pitches is linearly increased by about 2 μm. The space between the pitches according to an embodiment may be larger than the space between the pitches according to another embodiment.

An optimum space between the pitches might be designed according to relationship between the linear expansion coefficient of the base film 141 and that of the lower substrate 121.

The first input pad group IPG1 may be divided into input pad portions having a first pitch P1 to an eleventh pitch P11 in the direction from the center C to the edge E of the first input pad group IPG1. That is, the first input pad group IPG1 may be divided into the first input pad portion IPP1 having the first pitch P1 to the eleventh input pad portion IPP11 having the eleventh pitch P11. The pitch increases from the center C to the edge E.

In addition, the first input pad group IPG1 may include, for example, a plurality of the first input pad portions IPP1 having the first pitch P1.

The input pad portions IPP corresponding to the output pad portions OPP may be designed according to the expansion rate of the base film 141.

When the lower substrate 121 is connected to the base film 141, for example, an anisotropy conductive adhesive film 600 may be interposed between the lower substrate 121 and the base film 141. As shown in FIG. 6, the anisotropy conductive adhesive film 600 may include a thermosetting adhesive 610 and a conductive particle 620 sputtered in the thermosetting adhesive 610.

Figure 7:
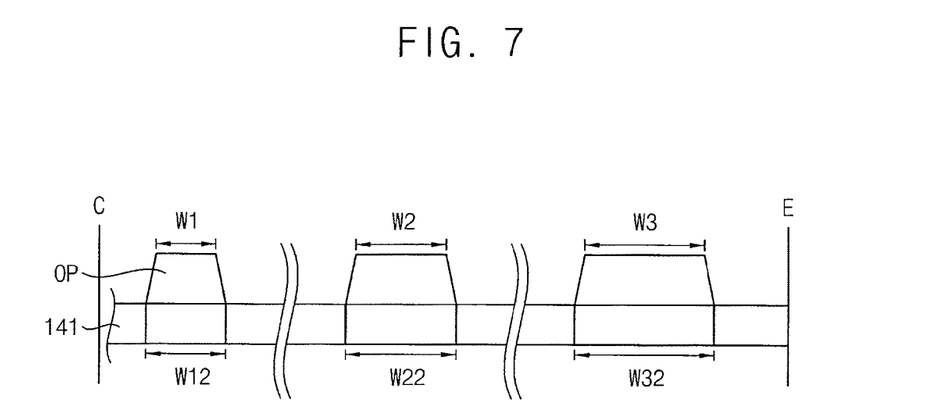
FIG. 7 is a cross-sectional view illustrating pads of the output pad group of FIG. 6.
Figure 8:
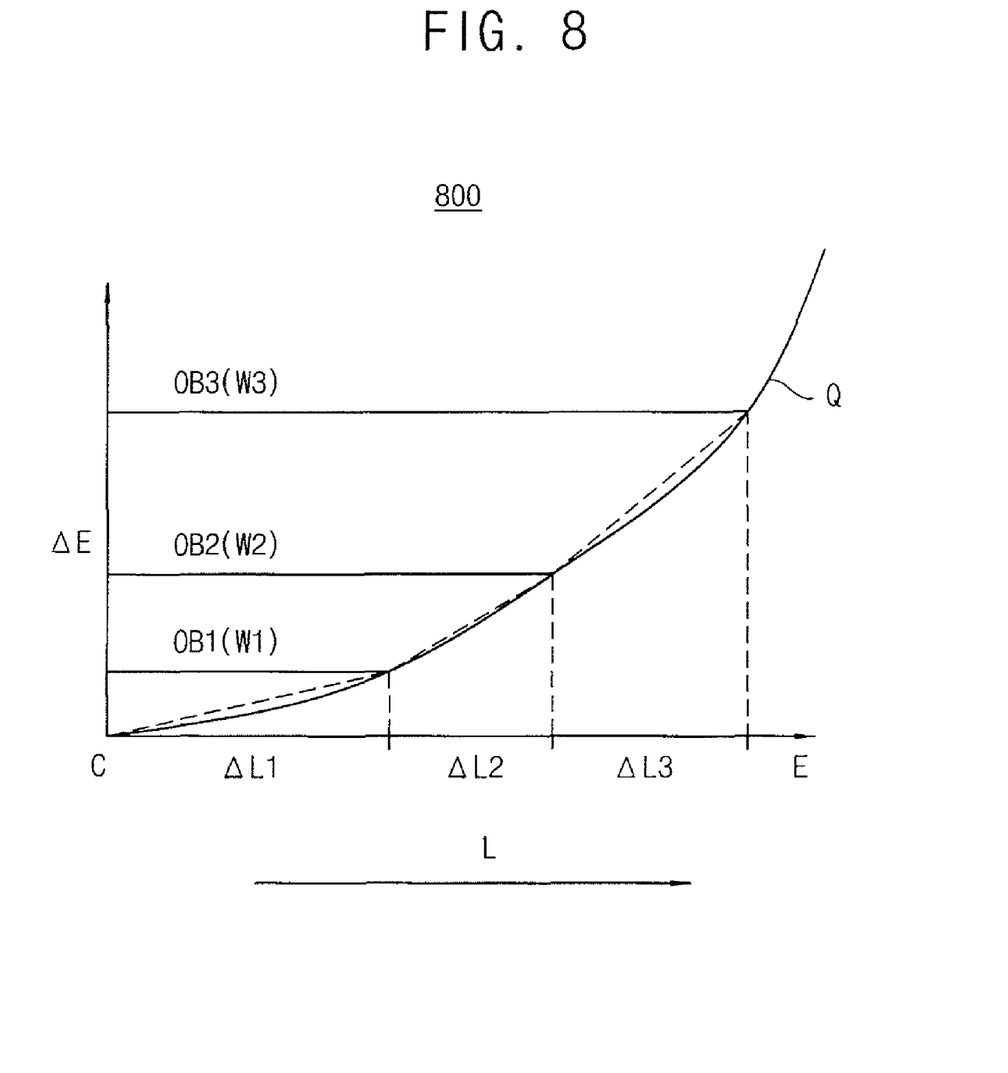
FIG. 8 is a graph showing a misalignment amount when input pads are connected to output pads in accordance with an exemplary embodiment of the present invention.

FIG. 7 is a cross-sectional view illustrating pads of the output pad group. FIG. 8 is a graph showing a misalignment amount when input pads are connected to output pads in accordance with an exemplary embodiment.

Referring to FIG. 7, the output pads OP are formed by etching photoresist patterns on Cu thin film of the base film 141. The output pads OP have a trapezoid shape. Accordingly, one output pad OP may have an upper side width W1 and a lower side width W12 greater than the upper side width W1.

Referring to FIG. 8, the graph 800 represents a misalignment amount, that is, a misalignment amount between the output pad group and the input pad group according to the distance from the center portion to the edge of the base film, before the width and the pitch are changed according to an exemplary embodiment.

For example, the x-axis of graph 800 represents the distance L from the center C of the base film 141. In addition, the y-axis of the graph 800 represents the alignment error amount ΔE, that is, an error amount of the first output pad group OPG1 of the base film 141 relative to the first input pad group IPG1 of the lower substrate 121.

In addition, the graph 800 represents that the amount ΔL non-linearly increases from the center C to edge E of the base film 141. That is, the graph 800 represents that the center C of the base film 141 is subject to less expansion by heat or pressure, and the edge E of the base film 141 is subject to more expansion by heat or pressure.

Accordingly, the pitch of the input pads IP and the width and the pitch of the output pads OP may vary to accommodate for the variation in expansion at the different locations.

As described in the graph 800, a non-linear curve Q may be divided into 3 linear portions, the number of the output pads OP which may be included in the output blocks OB1, OB2 and OB3 may be calculated according to each of the linear portions, and the widths of the output pads OP which are included in the first output block OB1 to the third output block OB3 may also be determined.

Accordingly, the non-linear curve Q may be divided into 3 linear portions, that is, 3 output blocks OB according to the misalignment amount ΔE. The non-linear curve Q is divided into 3 linear portions, so that the misalignment amount of each of the linear portions may be differently represented (since an area adjacent to the center C has a relatively small error amount, but an area adjacent to the edge E has a relatively greater error amount). That is, a distance change corresponding to the first output block OB1 is ΔL1, the distance change corresponding to the second output block OB2 is ΔL2, and the distance change corresponding to the third output block OB3 is ΔL3 (ΔL1>ΔL2>ΔL3).

Accordingly, since the widths of the first output block OB1 to the third output block OB3 vary, the number of the input pad portions IPP corresponding to each of the output blocks may be different for every output block. The number of the input pad portions IPP corresponding to the first output block OB1 is determined to prevent the misalignment generated due to the different expansion rate between the base film 141 and the lower substrate 121.

As a first example, as described in FIG. 5, the first output block OB1 (W1=15 μm) may correspond to the first input pad portion IPP1 to the sixth input pad portion IPP6. The second output block OB2 (W2=17 μm) may correspond to the seventh input pad portion IPP7 to the ninth input pad portion IPP9. The third output block OB3 (W3=19 μm) may correspond to the tenth input pad portion IPP10 to the eleventh input pad portion IPP11.

As a second example, although not shown, the first output block OB1 may correspond to the first input pad portion IPP1 to the seventh input pad portion IPP7. The second output block OB2 may correspond to the eighth input pad portion IPP8 to the tenth input pad portion IPP10. The third output block OB3 may correspond to only the eleventh input pad portion IPP11. The first output block OB1 of the second example has more of the input pad portions IPP than the first output block OB1 of the first example, since the linear expansion coefficient of the base film used in the second example is less than that of the base film used in the first example.

Referring to FIGS. 4 to 6, the first width W1 to the third width W3 of the output pads OP are designed to be smaller than or equal to the fourth width W4 of the input pads IP. According to an exemplary embodiment, the first width W1 to the third width W3 of the output pads OP are less than the fourth width W4 of the input pads IP. In a case in which the first width W1 to the third width W3 of the output pads OP are greater than the fourth width W4, when the misalignment between the output pads OP and the input pads IP is generated, one output pad OP may be connected to the adjacent input pad, not to the input pad IP corresponding to the output pad OP. Accordingly, the probability of an off-short being generated between the output pad OP and the input pad IP increases. When the fourth width W4 of the input pads IP is changed, the first width W1 to the third width W3 of the output pads OP may be changed to accommodate for the change of the fourth width W4.

In addition, the pitches of the output pad portions OPP formed on the base film 141 are designed to correspond one-to-one to the pitches of input pad portions IPP. That is, the output pad portions OPP have the substantially the same pitch as that of the corresponding input pad portions IPP, when the base film 141 is expanded.

For example, the values of the pitches of the output pads OP are set based on the expansion of the base film 141. Accordingly, the size of the base film 141 may be designed to be about 0.01% to 0.7% less than that of the lower substrate 121. According to an embodiment, the size of the base film 141 may be designed to be about 0.1% less than the side of the lower substrate 121. That is, the pitches of the output pad portions OPP are designed to be about 0.1% less than that of the input pad portions IPP. When the base film 141 is connected to the lower substrate 121, the base film 141 is expanded to substantially the same size as the lower substrate 121.

Accordingly, each of the output blocks OB having different widths from each other correspond to more than one input pad portions IPP having different pitches to finely control the alignment of the corresponding pads, thereby addressing the misalignment generated between the lower substrate 121 and the base film 141 and preventing connection defects.

As a result, the TCP 140, according to an exemplary embodiment, includes at least one output block OB having a plurality of output pads having substantially the same width and a plurality of output pad portions OPP having the substantially the same pitch in the output block OB. In addition, the width and pitch increase from the center C to the edge of the output pad group OPG.

The lower substrate 121, according to an exemplary embodiment, includes one input block IB having a plurality of input pads with substantially the same width and at a plurality of input pad portions IPP having a varying pitch in the input block IB, whereby the pitch increase from the center C to the edge E of the input pad group IPG.

For example, the input pad portions IPP correspond one-to-one to the output pad portions OPP, and the pitch relation between the input pad portions IPP and the output pad portions OPP may be designed to be about 0.1% less considering the rate of the expansion of the base film when the lower substrate and the TCP are manufactured.

Figure 9:
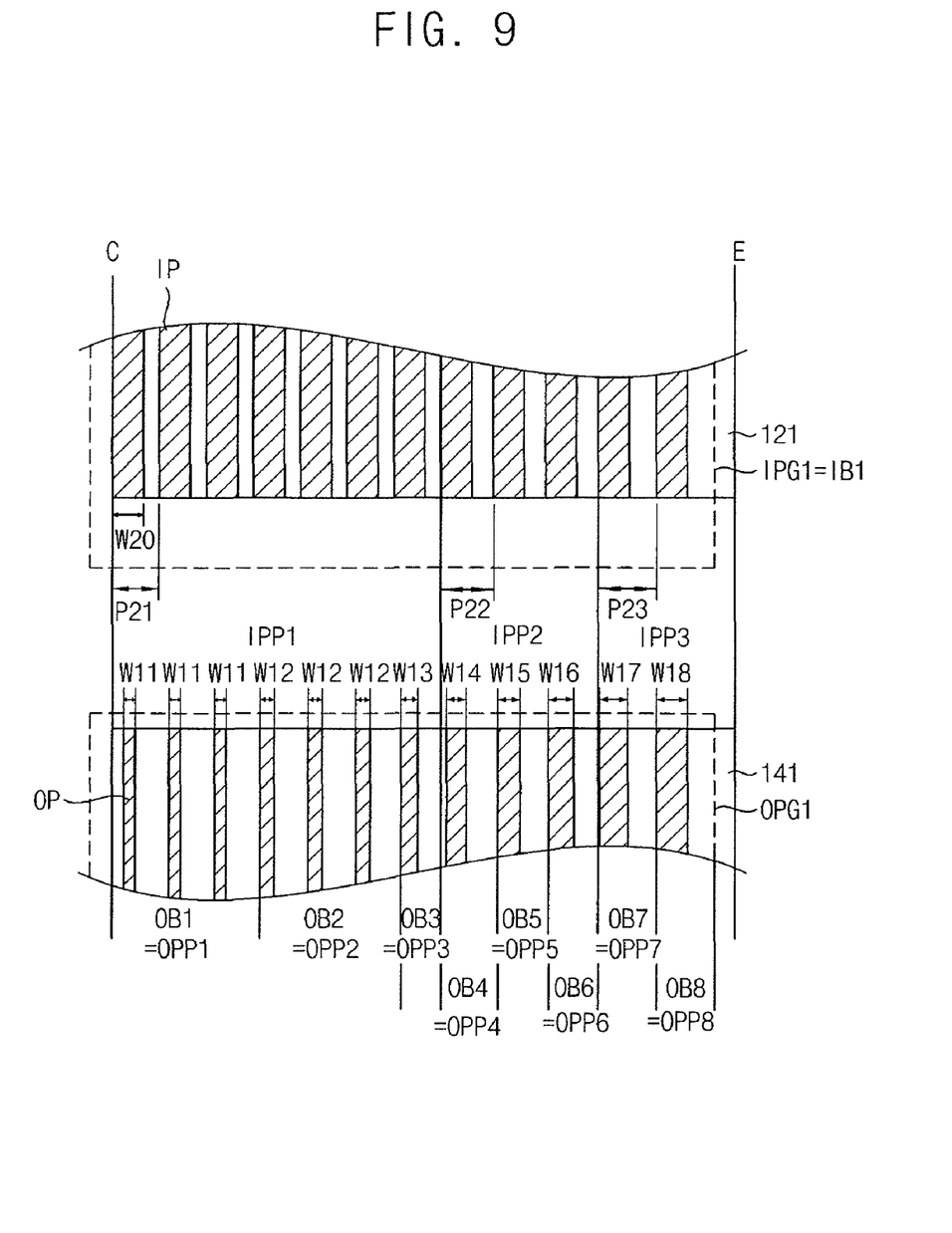
FIG. 9 is an enlarged plan view of a connection portion D of input pads and output pads in accordance with an exemplary embodiment of the present invention.

FIG. 9 is an enlarged plan view of a connection portion D of input pads and output pads in accordance with an exemplary embodiment.

Referring to FIG. 9, an LCD device 100 according to an exemplary embodiment is substantially the same as the LCD device 100 described with reference to FIGS. 1 to 8, except that the number of the input pad portion IPP formed on the lower substrate 121 is decreased in accordance with the decrease of the variation of the pitches of the input pad portions IPP.

Referring to FIG. 9, a first input pad group IPG1 formed on the lower substrate 121 according to an exemplary embodiment, for example, includes one input block having substantially the same width as the input pad group, and having a plurality of input pads having substantially the same width. The input block may be divided into 3 input pad portions IPP1, IPP2 and IPP3 according to pitches P21, P22 and P23. That is, the first input pad group IPG1 may be divided into a first input pad portion IPP1, a second input pad portion IPP2 and a third input pad portion IPP3 in a direction from a center C to an edge E of the input pad group IPG1. The input pad portion IPP may be divided to have input pads IP which have substantially the same width, but the input pad portions have different pitches.

Accordingly, 3 input pad portions IPP having different pitches may be formed in one input pad group IPG.

A twenty first pitch P21 to a twenty third pitch P23 of the input pads IP formed on the lower substrate 121 increases from the center C to the edge E of the first input pad group IPG1 (P21<P22<P23), since the expansion rate of the center C of the base film 141 is less than that of the edge E of the base film 141. Accordingly, the probability of the misalignment being generated at the edge E is greater than the probability of misalignment being generated at the center C. The pitch P23 of the input pads included the third input pad portion IPP3 disposed at the edge E is greater so that the input pads IP of the third input pad portion IPP3 may be more easily matched to those output pads OP corresponding to the input pads IP of the third input pad portion IPP3, when the misalignment is generated.

For example, the twentieth width W20 of the input pads IP of the third input pad portion IPP3 may be greater than the eleventh width W11 to the eighteenth width W18 of the output pads OP. Accordingly, the values of the eleventh width W11 to the eighteenth width W18 of the output pads may be designated based on the twentieth width W20 of the input pads IP of the liquid crystal panel 120. The values of the eleventh width W11 to the eighteenth width W18 of the output pads may be changed in accordance with a change of the twentieth width W20 of the input pads IP of the liquid crystal panel 120.

According to an exemplary embodiment, the number of the input pad portions IPP is 3. However, the number of the input pad portions IPP may be a plurality of numbers, for example, 6 or 11 depending on the pitch of the input pads IP. The number of the input pad portions IPP may be changed in accordance with the linear expansion coefficient of the base film 141.

Next, the output pads OP formed on the base film 141 will be explained.

The output pad group OPG1 formed on the base film 141 may be divided into the output blocks OB having the output pads OP having substantially the same width. Each of the output blocks OB may correspond one-to-one to the output pad portion OPP having the output pads OP having substantially the same width and the substantially the same pitch.

The first input pad group IPG1 is divided into 3 input pad portions IPP, so that the first output pad group OPG1 formed on the base film 141 corresponding to the first input pad group may be divided into the output blocks.

The output pads OP of the first output pad group OPG1 formed on the base film 141 have different widths W11 to W18. The width of the output pads OP increases from the center C to the edge E of the first output pad group OPG1.

The first output pad group OPG1 formed on the base film 141 may be divided to correspond to the first input pad portion IPP1 to the third input pad portion IPP3. However, the widths of the output pads OP have more than 3 types of widths (or, levels).

Accordingly, each of the input pad portions may correspond to the output pad portions OPP having different widths from each other. That is, one input pad portion IPP may correspond to more than one output pad portion OPP, wherein the output pad portions have output pads having the different widths from output pads of another output pad portion, and the output pad portions have different widths from each other.

The first input pad portion IPP1 may correspond to the first output block OB1 to the third output block OB3, the second input pad portion IPP2 may correspond to the fourth output block OB4 to the sixth output block OB6, and the third input pad portion IPP3 may correspond to the seventh output block OB7 to the eighth output block OB8. The number of the output blocks OB which correspond to the input pad portion IPP may be changed according to the expansion rate of the base film 141.

According to an exemplary embodiment, the number of output pad portions OPP is 8, but the number of output pad portions OPP may be changed.

Accordingly, the pitches of the input pads IP and the widths of the output pads OP might be set, considering a linear expansion coefficient of the base film 141 related to the lower substrate 121.

The first output pad group OPG1 may be divided into an eleventh width W11 to an eighteenth width W18 in a direction from the center C to the edge E of the first output pad group OPG1. That is, the first output pad group OPG1 may be divided into a first output pad portion OPP1 having the eleventh width W11 to an eighth output pad portion OPP8 having the eighteenth width W18. The widths increase from the center C to the edge E of the first output pad group OPG1.

The design of the output pad portions OPP corresponding to the input pad portions IPP may be selectively changed according to the expansion rate of the base film 141.

Accordingly, one input pad portion IPP corresponds to more than one output pad portion OPP having output pads with different widths from each other, thereby improving alignment details between the output pads OP and the input pads IP, reducing connection defects and improving the reliability of the connection.

As a result, the TCP 140, according to an exemplary embodiment, includes one output pad group OPG having at least one output block OB with output pads having substantially the same width. Also, the width and pitch of the output pad group increase from the center C to the edge E of the output pad group OPG.

In addition, the lower substrate 121, according to an exemplary embodiment, includes one input block IB having input pads with substantially the same width and a plurality of input pad portions IPP, each having a relatively constant pitch within the input pad portion, but varying between input pad portions. Also, the width and pitch increase from the center C to the edge E of the input pad group IPG.

For example, one input pad portion IPP corresponds to more than one output pad portion OPP, and a pitch of the output pad portions OPP may be designed to be 0.1% less than a pitch of the corresponding input pad portions, in consideration of an expansion rate of the base film when the lower substrate and the TCP are manufactured.

According to the embodiments of the present invention, pitches of input pads formed on a liquid crystal panel are changed, and widths of output pads formed on a base film are changed, to thereby improve image quality uniformity.

In addition, when a lower substrate of the liquid crystal panel is connected to a base film of a TCP, the base film expands more than the lower substrate by heat or pressure. Accordingly, the pitches and widths of the output pads are variably designed, thereby ensuring the highest process margin for misalignments of the input pads to minimize image quality defects and to improve the long-term reliability.

The foregoing is illustrative of the embodiments of the present invention and is not to be construed as limiting thereof. Although a few example embodiments of the present invention have been described, those skilled in the art will readily appreciate that many modifications are possible. Accordingly, all such modifications are intended to be included within the scope of the present invention as defined in the claims.

What is claimed is:

1. A tape carrier package comprising:
   a base film;
   an integrated circuit (IC) chip formed on the base film; and
   an output pad group formed on a portion of the base film, the output pad group comprising a plurality of output blocks, each of the output blocks comprising a plurality of output pads having substantially the same width as each other, wherein a width of the output pads corresponding to one of the output blocks differs from a width of the output pads corresponding to another output block adjacent to the one of the output blocks, wherein a space width between output pads in an output block increases with increasing distance from a center portion of the base film.

2. The tape carrier package of claim 1, wherein the output pad group comprises:
   a first output block comprising a plurality of output pads having a first width;
   a second output block comprising a plurality of output pads having a second width wider than the first width; and
   a third output block comprising a plurality of output pads having a third width wider than the second width.

3. The tape carrier package of claim 2, wherein the first output block, the second output block and the third output block are sequentially disposed from a center portion of the base film to an edge of the base film.

4. The tape carrier package of claim 1, wherein the widths of the output pads of each of the output blocks increase from a center portion of the base film to an edge of the base film.

5. The tape carrier package of claim 4, wherein each of the output blocks respectively comprises at least one output pad portion having substantially the same pitch between output pads, and adjacent output pad portions have different pitches from each other.

6. The tape carrier package of claim 5, wherein the pitches of the output pad portions increase from the center portion of the base film to an edge of the base film.

7. The tape carrier package of claim 1, wherein each of the output blocks comprises at least one output pad portion having substantially the same pitch between output pads, and adjacent output pad portions have different pitches from each other.

8. The tape carrier package of claim 7, wherein the pitches of the output pad portions increase from a center portion of the base film to an edge of the base film.

9. A liquid crystal display device comprising:
   a printed circuit board (PCB);
   a tape carrier package (TCP) comprising:
      a base film;
      an integrated circuit (IC) chip formed on the base film; and
      an output pad group formed on a portion of the base film, the output pad group comprising a plurality of output blocks, each of the output blocks comprising a plurality of output pads having substantially the same width as each other, wherein a width of the output pads corresponding to one of the output blocks differs from a width of the output pads corresponding to another output block adjacent to the one of the output blocks, wherein a space width between output pads in an output block, increases with increasing distance from a center portion of the base film; and
   a liquid crystal panel comprising a lower substrate, an upper substrate and a liquid crystal layer interposed between the lower substrate and the upper substrate, and receiving signals from the PCB through the TCP.

10. The liquid crystal display device of claim 9, wherein the liquid crystal panel comprises an input pad group having a plurality of input pads which have substantially the same width as each other, and the input pad group corresponds one-to-one to the output pad group formed on the base film.

11. The liquid crystal display device of claim 10, wherein the input pad group comprises a plurality of input pad portions, each of the input pad portions having a pitch between input pads, and a pitch of one of the input pad portions differs from a pitch of another input pad portion adjacent to the one of the input pad portions.

12. The liquid crystal display device of claim 11, wherein the pitches of each of the input pad portions increase from a center portion of the input pad group to an edge of the input pad group.

13. The liquid crystal display device of claim 12, wherein the widths of each of the input pads is wider than the widths of each of the output pads.

14. The liquid crystal display device of claim 12, wherein the pitches between the output pads are proportional to the pitches between the input pads, and a whole width of the base film on which the output pads are formed is less than a whole width of the output pad group by about 0.1% when the base film is expanded.

15. The liquid crystal display device of claim 14, wherein the widths of the output pads of each of the output blocks increase from the center portion of the base film to the edge of the base film.

16. The liquid crystal display device of claim 10, wherein the widths of the output pads of each of the output blocks increase from a center portion of the base film to an edge of the base film.

17. The liquid crystal display device of claim 16, wherein the widths of each of the input pads is wider than the widths of each of the output pads.

* * * * *